(12) United States Patent
Zheng et al.

(10) Patent No.: US 7,424,044 B2
(45) Date of Patent: Sep. 9, 2008

(54) SEMICONDUCTOR LASER DEVICE

(75) Inventors: Yujin Zheng, Hamamatsu (JP); Hirofumi Kan, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 11/350,273

(22) Filed: Feb. 9, 2006

(65) Prior Publication Data

US 2006/0193363 A1  Aug. 31, 2006

(30) Foreign Application Priority Data

Feb. 14, 2005  (JP)  ............................ P2005-036841

(51) Int. Cl.
*H01S 5/00* (2006.01)
*H01S 3/00* (2006.01)
(52) U.S. Cl. ...................... 372/50.12; 372/99
(58) Field of Classification Search .................. 372/99, 372/101, 50.12, 34–36
See application file for complete search history.

(56) References Cited

U.S. PATENT DOCUMENTS 4,813,762 A * 3/1989 Leger et al. ................. 359/565
4,976,539 A * 12/1990 Carlson et al. ............. 356/5.05
5,434,874 A * 7/1995 Fouquet et al. ................ 372/20
5,513,201 A * 4/1996 Yamaguchi et al. ........... 372/75
5,761,227 A * 6/1998 Hargis et al. ................... 372/22

FOREIGN PATENT DOCUMENTS

JP  3071360  5/2000

* cited by examiner

*Primary Examiner*—Minsun Harvey
*Assistant Examiner*—Patrick Stafford
(74) *Attorney, Agent, or Firm*—Drinker Biddle & Reath LLP (57) ABSTRACT

The semiconductor laser device 1A has a semiconductor laser array 3 including a plurality of active layers 2 arranged in parallel along a slow direction, and outputs laser beams from the front end face 2a side of the active layers 2. The semiconductor laser device 1A comprises a collimating lens 5 that collimates laser beams L1 outputted from the respective rear end faces 2b of the active layers 2 within a plane orthogonal to the slow axis, and a reflecting mirror 9 that feeds back parts of the laser beams L2 outputted from the collimating lens 5 to the respective active layers 2 via the collimating lens 5.

5 Claims, 11 Drawing Sheets

SEMICONDUCTOR LASER DEVICE

BACKGROUND OF THE INVENTION

1. Field of the Invention

This invention relates to a semiconductor laser device that outputs laser beams from a front end face side of an active layer of a semiconductor laser array.

2. Related Background of the Invention

As a conventional semiconductor laser device, one is known (for example, Document 1: Japanese Patent Publication No. 3071360) that comprises a semiconductor laser array including a plurality of active layers, while setting a first direction to an optical axis direction, a second direction to a slow axis direction, and a third direction to a fast axis direction, arranged in parallel along a second direction a collimating lens that collimates laser beams outputted from each active layer of the semiconductor laser array within a plane orthogonal to the second direction, and an optical path converter that receives the respective laser beams outputted from the collimating lens and rotates the laser beams by almost 90° around the optical axis.

SUMMARY OF THE INVENTION

Generally, expansion angles in the slow axis direction of laser beams outputted from each active layer of the semiconductor laser array are 8° through 10°, and expansion angles in the fast axis direction are 30° through 40°. However, laser beams finally outputted from the semiconductor laser device are required to be small in expansion angles in terms of application to various technical fields.

However, the conventional semiconductor laser device has the following problems. That is, the laser beams outputted from the respective active layers of the semiconductor laser array are almost rotated by almost 90° around the optical axis by the optical path converter after being collimated within the plane orthogonal to the second direction by the collimating lens. Therefore, the expansion angles in the slow axis direction of the laser beams outputted from the respective active layers remain in the laser beams to be finally outputted from the semiconductor laser device.

Therefore, the invention was made in view of these circumstances, and an object thereof is to provide a semiconductor laser device which reduces the expansion angles in the slow axis direction of laser beams outputted from the respective active layers of a semiconductor laser array and outputs the laser beams.

In order to achieve the object, the semiconductor laser device according to the invention comprises a semiconductor laser array having a plurality of active layers, while setting a first direction to an optical axis direction, the second direction to a slow axis direction, and a third direction to a fast axis direction, arranged in parallel along a second direction and outputs laser beams from a front end face side of the active layers, comprising a collimating lens that collimates laser beams outputted from respective rear end faces of the active layers within a plane orthogonal to the second direction, and a first optical element that feeds back respective parts of the laser beams outputted from the collimating lens to the respective active layers via the collimating lens.

In this semiconductor laser device, laser beams outputted from the rear end faces of the respective active layers of the semiconductor laser array are collimated within a plane orthogonal to the second direction by the collimating lens. Thereby, laser beams that have expansion angles in the slow axis direction and do not have expansion angles in the fast axis direction are outputted from the collimating lens. Parts of the laser beams are fed back to the respective active layers via the collimating lens by the first optical element. Then, when the parts of the laser beams fed back to the respective active layers are reflected by, for example, the front end faces of the active layers, the parts of the laser beams are outputted again from the rear end faces of the active layers. Thereby, the parts of the laser beams reciprocate between the first optical element and, for example, the front end faces of the active layers while being amplified by the active layers. The amplified parts of the laser beams are outputted from the front end face side of the active layers. Parts of laser beams thus reciprocate between the first optical element and, for example, the front end faces of the active layers while being amplified by the active layers, whereby it becomes possible to reduce the expansion angles in the slow axis direction of the laser beams outputted from the respective active layers of the semiconductor laser array and output the laser beams.

In the semiconductor laser device according to the invention, it is preferable that the first optical element is disposed while being inclined with respect to a plane orthogonal to the first direction. Thereby, it becomes possible to further reduce the expansion angles in the slow axis direction of the laser beams outputted from the respective active layers of the semiconductor laser array and output the laser beams.

In the semiconductor laser device according to the invention, it is preferable that the first optical element has transmitting portions that transmit respective remainders of the laser beams outputted from the collimating lens. Thereby, the respective remainders of the laser beams outputted from the collimating lens are prevented from reaching the semiconductor laser array, whereby heating of the semiconductor laser array can be restrained.

In the semiconductor laser device according to the invention, it is preferable that the first optical element bragg-reflects and feeds back respective laser beams with a specific wavelength of the laser beams outputted from the collimating lens to the respective active layers Thereby, parts of laser beams with a specific wavelength reciprocate between the first optical element and, for example, the front end faces of the active layers while being amplified by the active layers. Therefore, it becomes possible to reduce the expansion angles in the slow axis direction of the laser beams outputted from the respective active layers of the semiconductor laser array, narrow the band of the wavelength spectrum of the laser beams, and output the laser beams.

In the semiconductor laser device according to the invention, it is preferable that the semiconductor laser device comprises a second optical element that has a light reflectance lower than that of the first optical element, and bragg-reflects and feeds back respective laser beams with a specific wavelength of laser beams outputted from the respective front end faces of the active layers to the respective active layers. Thereby, parts of laser beams with a specific wavelength reciprocate between the first optical element and the second optical element while being amplified by the active layers. The amplified parts of the laser beams are transmitted through the second optical element and outputted (from the front end face side of the active layers). Therefore, it becomes possible that the expansion angles in the slow axis direction of the laser beams outputted from the respective active layers of the semiconductor laser array are reduced, and the band of the wavelength spectrum of the laser beams is narrowed, and the laser beams are outputted.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS

Hereinafter, preferred embodiments of the semiconductor laser device of the invention are explained in detail with reference to the drawings.

First Embodiment

Figure 1:
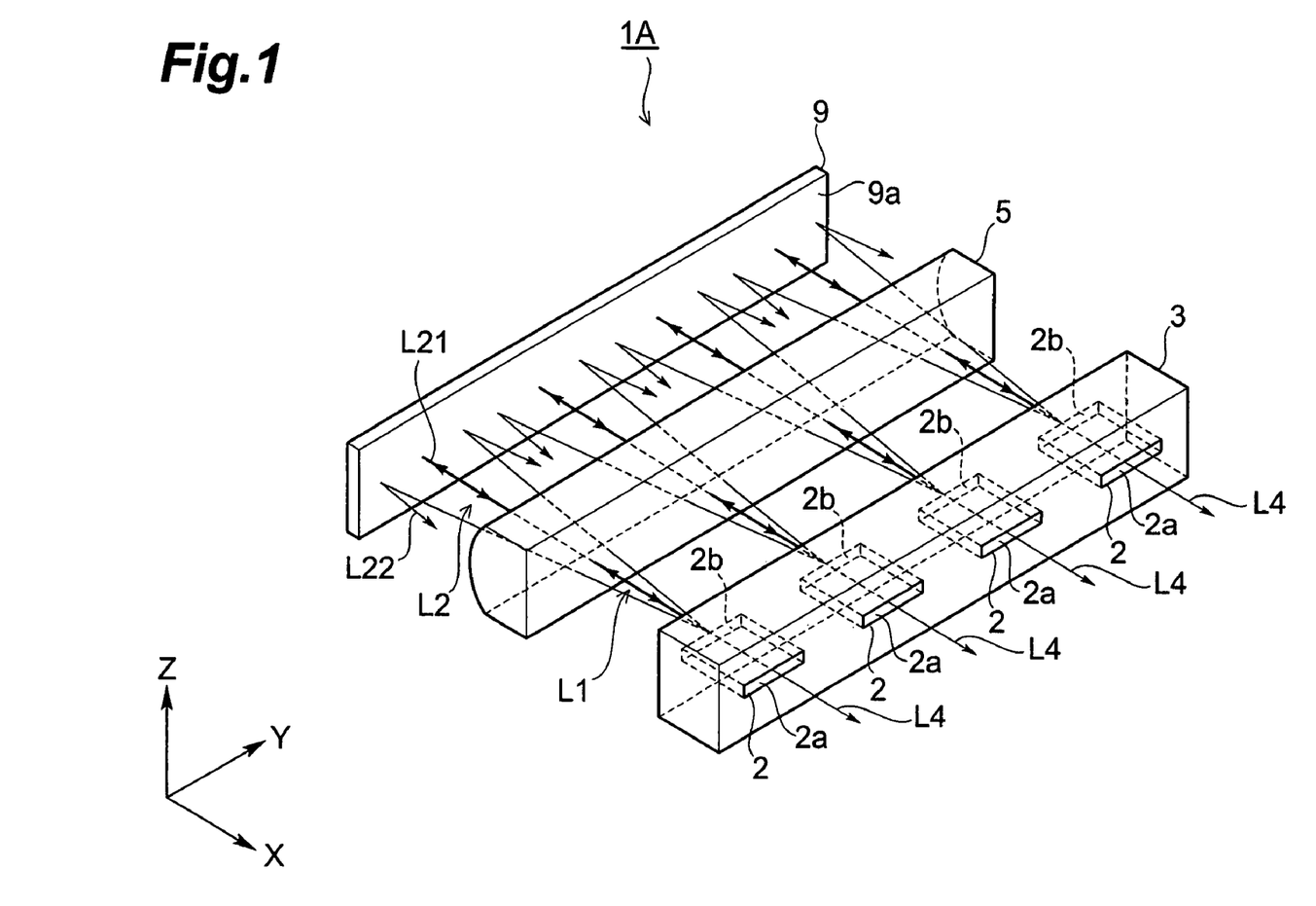
FIG. 1 is a perspective view of a first embodiment of a semiconductor laser device according to the invention.
Figure 2:
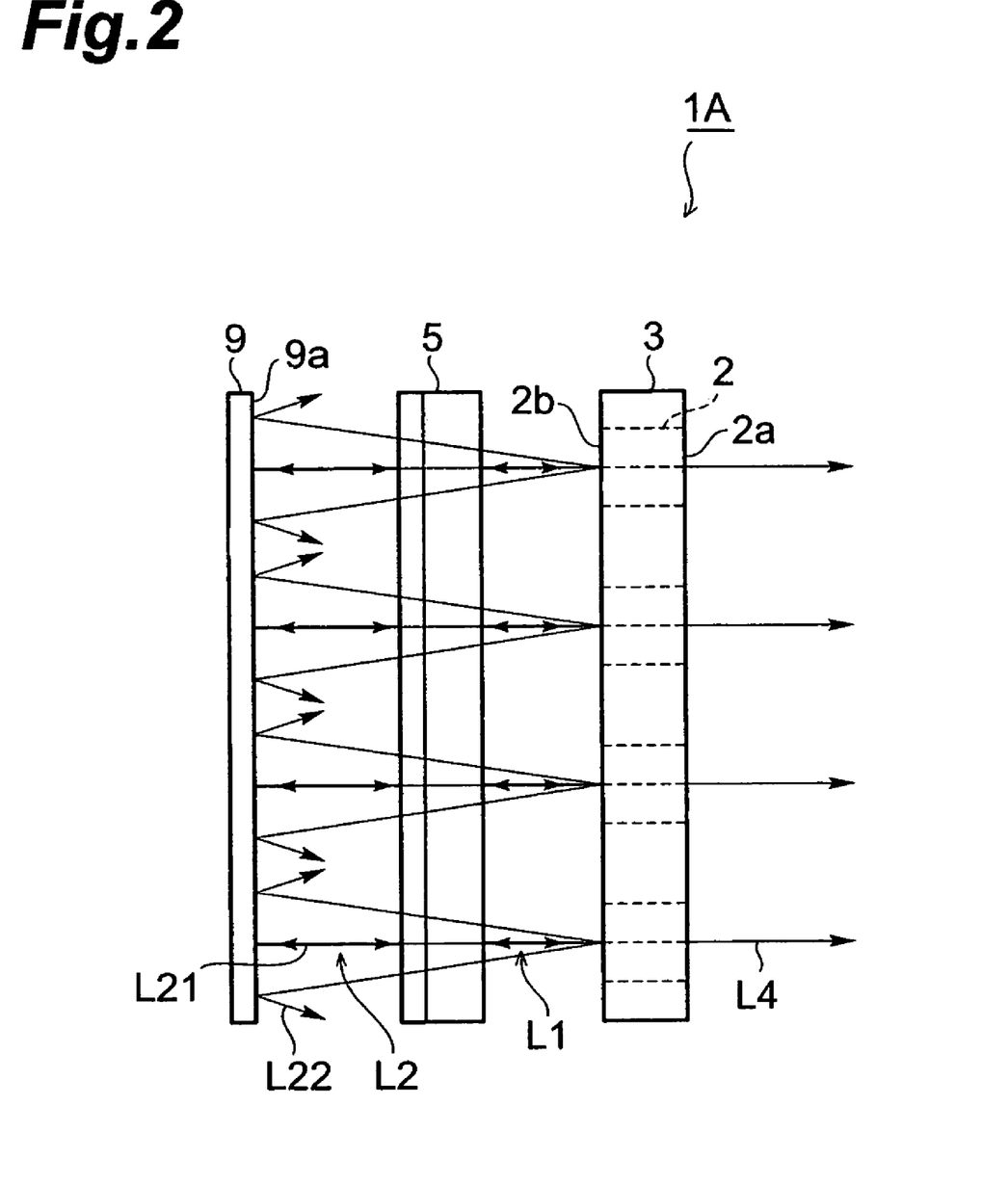
FIG. 2 is a plan view of the semiconductor laser device of FIG. 1.
Figure 3:
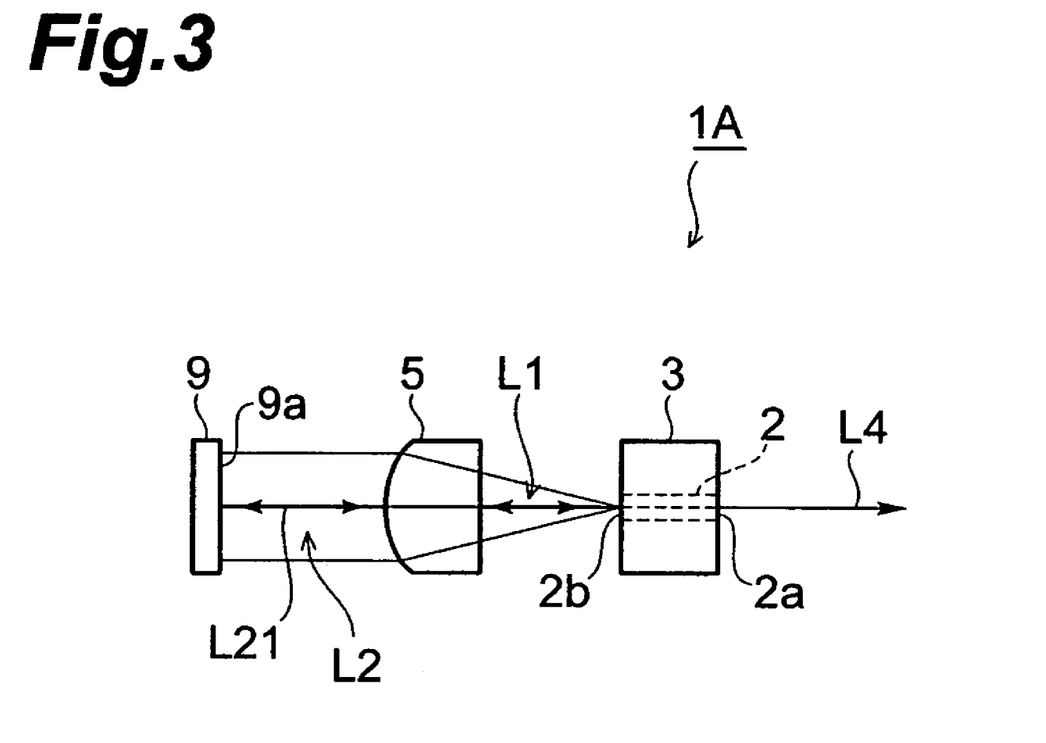
FIG. 3 is a side view of the semiconductor laser device of FIG. 1.

As shown in FIG. 1, FIG. 2, and FIG. 3, the semiconductor laser device 1A is a device for outputting laser beams forward, and comprises a semiconductor laser array 3 including a plurality of active layers 2 arranged in parallel along the Y axis direction while the X axis direction (first direction) is set to an optical axis direction, the Y axis direction (second direction) is set to a slow direction, and the Z axis direction (third direction) is set to a fast direction. The semiconductor laser array 3 is shaped into a rectangle thin and long in the Y axis direction, and has a length of approximately 10 millimeters in the Y axis direction. The active layers 2 are aligned at intervals of approximately 500 micrometers along the Y axis direction, and have a width of approximately 100 micrometers in the Y axis direction and a thickness of approximately 1 micrometer in the Z axis direction. The front end faces 2a of the active layers 2 reach the front end face of the semiconductor laser array 3, and the rear end faces 2b of the active layers 2 reach the rear end face of the semiconductor laser array 3. On the front end faces 2a of the respective active layers 2, reflection suppressing films with a reflectance of about 10% for laser beams generated at the active layers 2 are formed. On the rear end faces 2b of the respective active layers 2, reflection suppressing films with a reflectance of several percents for laser beams generated at the active layers 2 are formed. Namely, the reflectance for the laser beams generated at the active layers 2 is set higher on the reflection suppressing films formed on the front end faces 2a than on the reflection suppressing films formed on the rear end faces 2b.

Laser beams outputted rearward from the rear end faces 2b of the respective active layers 2 have expansion angles of approximately 30° in the Z axis direction and approximately 8° in the Y axis direction from the optical axis parallel to the X axis. Thus, the laser beams outputted from the active layers 2 have great expansion angles in the Z axis direction, so that the collimating lens 5 is disposed rearward of the semiconductor laser array 3 to restrain the expansion in the Z axis direction.

This collimating lens 5 is thin and long in the Y axis direction, and has a length of approximately 0.4 millimeters in the X axis direction, a length of approximately 12 millimeters in the Y axis direction, and a length of approximately 0.6 millimeters in the Z axis direction. The collimating lens 5 has no refractive effect within a plane, orthogonal to the Z axis direction (that is, the XY plane), but has a refractive effect within a plane orthogonal to the Y axis direction (that is, the ZX plane). Therefore, the collimating lens 5 refracts and collimates the respective laser beams outputted from the rear end faces 2b of the respective active layers 2 of the semiconductor laser array 3 within the ZX plane.

A reflecting mirror 9 (first optical element) that feeds back arts of the respective laser beams outputted from the collimating lens 5 to the active layers via the collimating lens 5 is disposed rearward of the collimating lens 5. The reflecting mirror 9 has a plate shape thin and long in the Y axis direction, and has a length of approximately 1 through 2 millimeters in the X axis direction, a length of approximately 12 through 15 millimeters in the Y axis direction, and a length of approximately 1 through 5 millimeters in the Z axis direction. This reflecting mirror 9 has a reflecting surface 9a that reflects laser beams outputted from the collimating lens 5 parallel to the YZ plane. This reflecting surface 9a is formed by forming a reflecting film on the front face of the base material of the reflecting mirror 9 made of a translucent material such as glass or quartz.

Operations of the semiconductor laser device 1A are explained. From the rear end faces 2b of the respective active layers 2 of the semiconductor laser array 3, laser beams L1 are outputted rearward along the X axis direction. The laser beams L1 have expansion angles of approximately 8° in the Y axis direction and approximately 30° in the Z axis direction from the optical axis. The outputted laser beams L1 are all made incident on the collimating lens 5, and collimated within the ZX plane. Thereby, from the collimating lens 5, laser beams L2 that have expansion angles of approximately 8° in the Y axis direction and have no expansion angles in the Z axis direction are outputted rearward. Then, the laser beams L2 from the collimating lens 5 are made incident on the reflecting mirror 9.

In the laser beams L2 made incident on the reflecting mirror 9, partial laser beams L21 made incident almost perpendicularly on the reflecting surface 9a are reflected almost in the opposite direction by the reflecting surface 9a, and are fed back to the respective active layers 2 via the collimating lens 5 again by tracing optical paths in reverse to the optical paths reaching the reflecting surface 9a from the active layers 2. On the other hand, laser beams L22 other than the laser beams L21 of the laser beams L2 are not fed back to the respective active layers 2 even after being reflected by the reflecting surface 9a. Parts of the laser beams L21 fed back to the respective active layers 2 are reflected by the front end faces 2a of the active layers 2, and the parts thereof are outputted again from the rear end faces 2b of the active layers 2. Thus, an external resonator that makes laser beams reciprocate between the reflecting surface 9a of the reflecting mirror 9 and the front end faces 2a of the active layers 2 is formed. In the laser beams outputted from the active layers 2, only partial laser beams L21 made incident almost perpendicularly on the reflecting surface 9a (that is, having small angles with the X axis) reciprocate between the reflecting mirror 9 and the front end faces 2a while being amplified by the active layers 2. Then, the light intensities of the laser beams are amplified during reciprocation, and parts of the reciprocating laser beams are transmitted through the front end faces 2a of the active layers 2 and finally outputted from the front end faces 2a as laser beams L4.

Thus, in the semiconductor laser device 1A, in laser beams generated at the active layers 2, only laser beams having small angles with the X axis selectively reciprocate between the reflecting mirror 9 and the active layers 2 while being amplified by the active layers 2. Therefore, the laser beams L4 to be outputted from the front end faces 2a become laser beams with components having small angles with the X axis (that is, components with small expansion angles in the Y axis direction) being selectively amplified. Therefore, according to the semiconductor laser device 1A, it becomes possible to reduce the expansion angles in the Y axis direction (slow axis direction) of the laser beams outputted from the respective active layers 2 of the se miconductor laser array 3 and output the laser beams L4.

Figure 4:
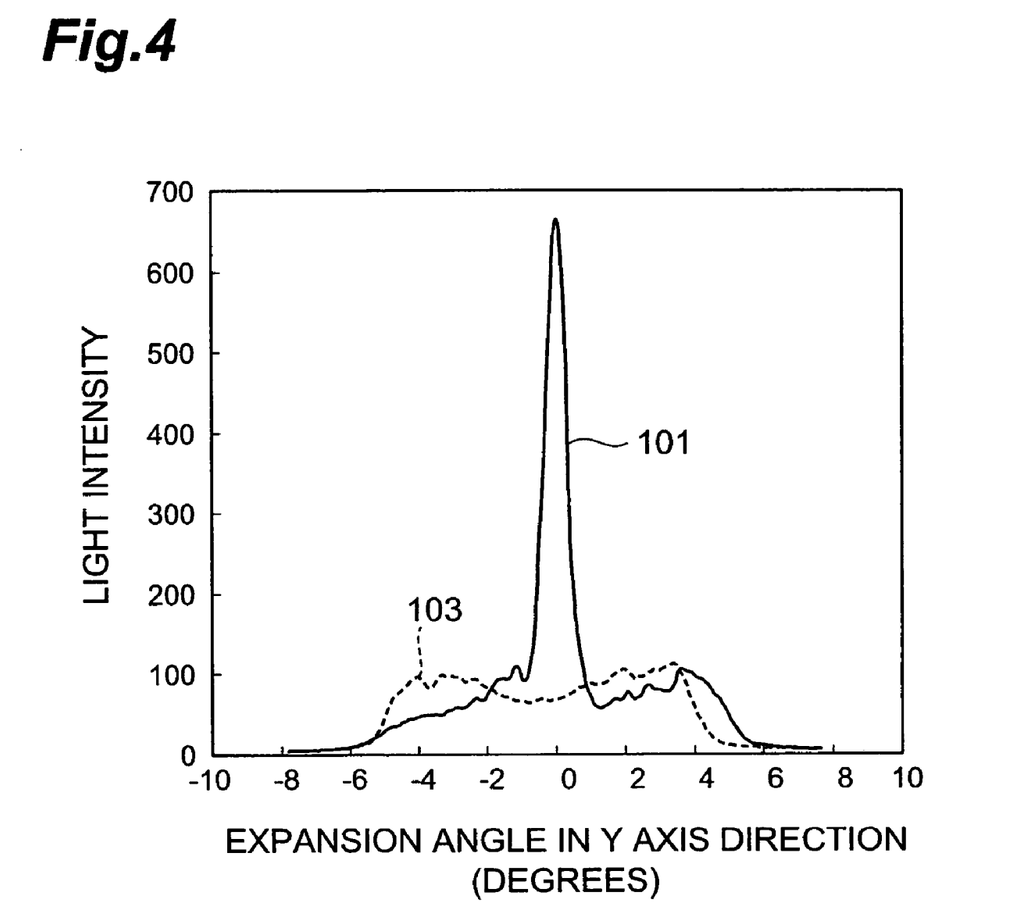
FIG. 4 is a diagrammatic drawing of light intensity distribution with respect to expansion angles of laser beams.

FIG. 4 is a diagram of light intensity distribution of laser beams L4 to be outputted from the front end faces 2a of the active layers 2 as output light of the semiconductor laser device 1A and laser beams L1 to be outputted from the rear end faces 2b of the active layers 2. In FIG. 4, the horizontal axis indicates expansion angles of laser beams in the Y axis direction from the optical axis of the active layers 2, and the vertical axis indicates light intensities of the laser beams. The intensity distribution 101 of laser beams L4 to be outputted from the semiconductor laser device 1A have a peak more acute than that of the intensity distribution 103 of laser beams L1 to be outputted from the active layers 2. This indicates that the expansion angles in the Y axis direction of the laser beams to be outputted from the semiconductor laser device 1A are small. These expansion angles become, as shown in FIG. 4, equal to or less than 1° in the case of the semiconductor laser device 1A, much smaller than the expansion angles of 8° of the laser beams to be outputted from the active layers 2, although they differ depending on various conditions such as dimensions of the active layers 2.

As described above, in the semiconductor laser device 1A, a complicated optical system is not necessary, and the construction becomes simple, so that the device can be downsized. In addition, the semiconductor laser device 1A can reduce the expansion angles in the Y axis direction of the laser beams to be outputted, so that the laser beams usability is improved. When the semiconductor laser device 1A is used as an excitation source of a solid laser device, no optical system is disposed, in the outputting direction in the device 1A, so that the assembling becomes easy. The semiconductor laser device 1A can be disposed near a solid laser medium, so that the excitation efficiency for the solid laser medium is improved. Even when the semiconductor laser device 1A is optically coupled to a condensing optical system or optical fibers and applied to a laser beam machine or the like, the laser beam usability is improved, optical position alignment of a condensing optical system and optical fibers becomes easy, and the possibility of design is improved.

Figure 5:
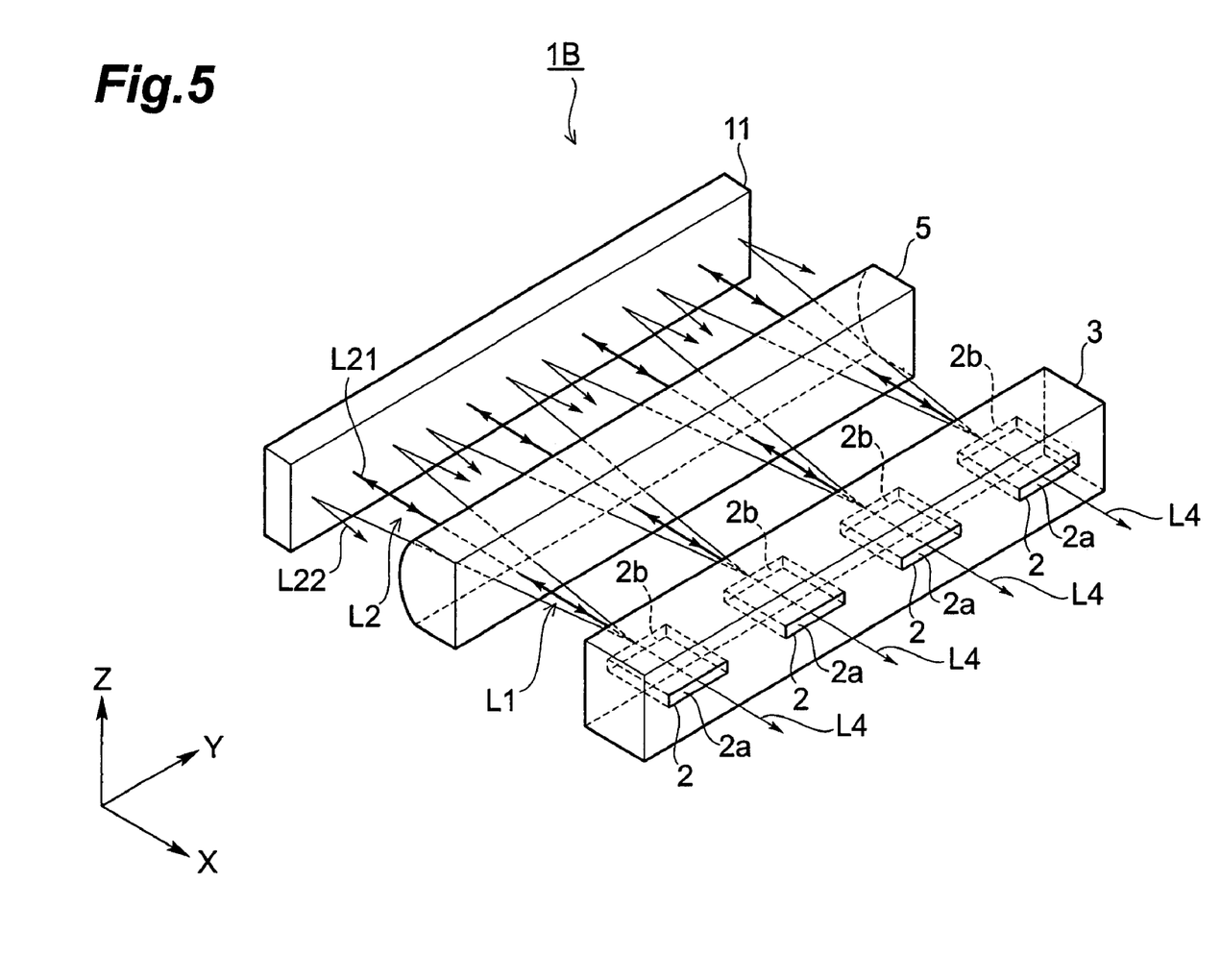
FIG. 5 is a perspective view of a modified example of the semiconductor laser device of the first embodiment.

It is also possible that, as in the semiconductor laser device 1B shown in FIG. 5, a wavelength selecting element 11 (first optical element) that bragg-reflects laser beams with a specific wavelength can be installed in place of the reflecting mirror 9 of the semiconductor laser device 1A. The wavelength selecting element 11 is an optical element having characteristics that have a high reflectance (for example, 95%) only for laser beams close to a specific wavelength $\lambda 1$ (for example, 808.0 nanometers) and rarely reflects other laser beams. For example, as such a wavelength selecting element, the Luxx Master™ made by PD-LD Inc. is known. In such a semiconductor laser device 1B, only laser beams close to a specific wavelength $\lambda 1$ in the laser beams L2 outputted from the collimating lens 5 are bragg-reflected by the wavelength selecting element 11 and fed back to the active layers 2. The laser beams to be fed back to the active layers 2 reciprocate between the wavelength selecting element 11 and the front end faces 2a of the active layers 2 while being amplified by the active layers 2. Therefore, the laser beams to be finally outputted forward from the front end faces 2a are laser beams with selectively amplified components of the wavelength $\lambda 1$. Therefore, according to the semiconductor laser device 1B, the expansion angles in the Y axis direction of the laser beams outputted from the respective active layers 2 of the semiconductor laser array 3 can be reduced, and the band of the wavelength spectrum of the laser beams can be narrowed, and the laser beams L4 can be outputted.

Next, other embodiments of the semiconductor laser device of the invention are explained. In the following second through sixth embodiments, the components identical to or equivalent to those of the first embodiment are attached with the same symbols and overlapping explanation is omitted.

Second Embodiment

Figure 6:
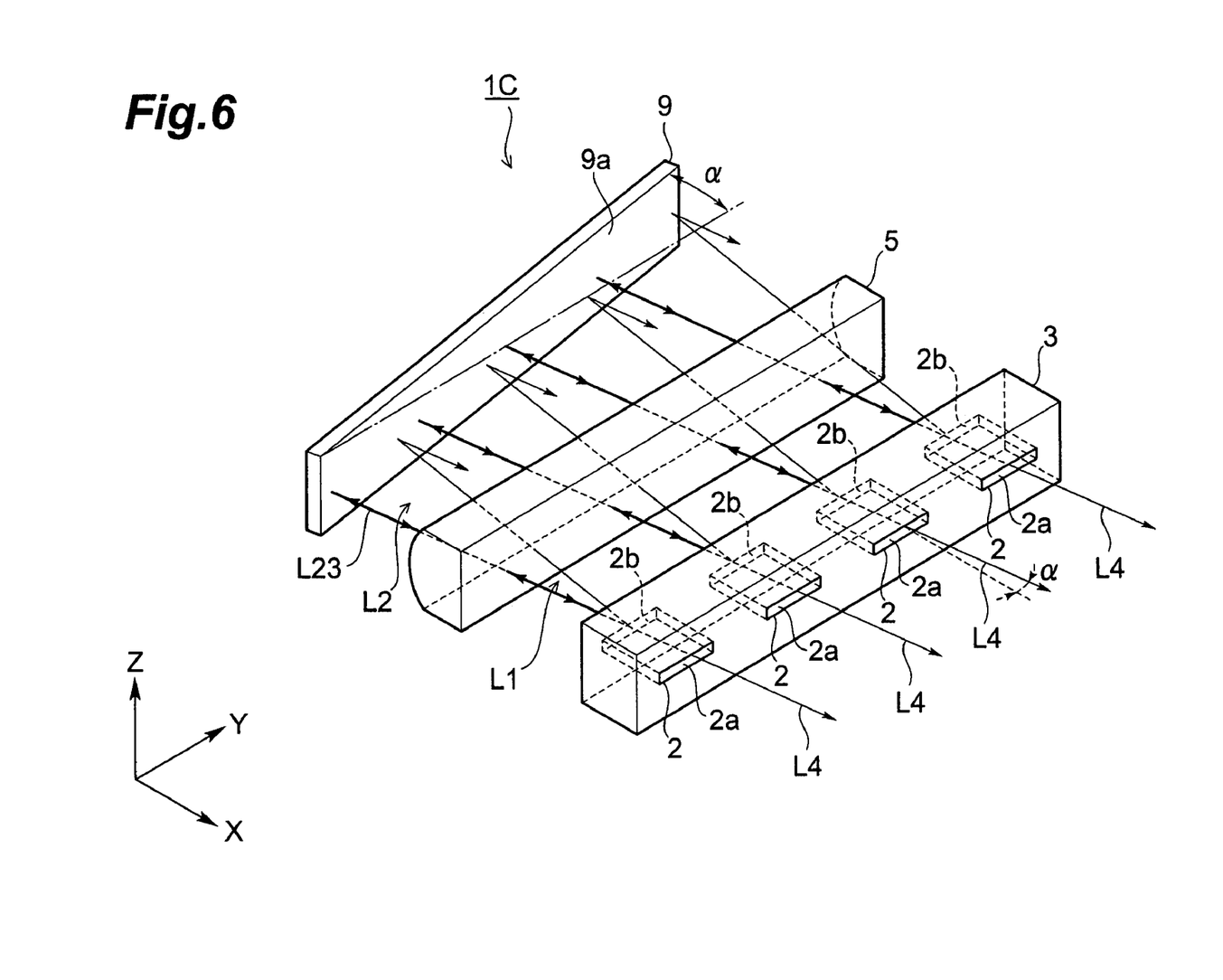
FIG. 6 is a perspective view of a second embodiment of a semiconductor laser device of the invention.

As shown in FIG. 6, the semiconductor laser device 1C is different from the semiconductor laser device 1A in that the reflecting mirror 9 is disposed while inclined with respect to a plane orthogonal to the X axis direction (that is, the YZ plane). In detail, this reflecting mirror 9 is disposed so as to have an angle $\alpha$ with the YZ plane, and the reflecting surface 9a of the reflecting mirror 9 is inclined by the angle $\alpha$ with the YZ plane around the Z axis. Therefore, in the semiconductor laser device 1C, in laser beams L2 outputted rearward from the collimating. lens 5, only laser beams L23 outputted in the direction at the angle $\alpha$ with the X axis are selectively amplified by an external resonator formed between the reflecting surface 9a and the respective front end faces 2a. Thereby, the expansion angles in the Y axis direction of the laser beams outputted from the respective active layers 2 of the semiconductor laser array 3 are further reduced, whereby it becomes possible to output laser beams L4 in a direction at the angle $\alpha$ with the X axis.

Also in the semiconductor laser device 1C, the wavelength selecting element 11 can be installed in place of the reflecting mirror 9. Thereby, it becomes further possible to narrow the band of the wavelength spectrum of the laser beams and output the laser beams L4.

Third Embodiment

Figure 7:
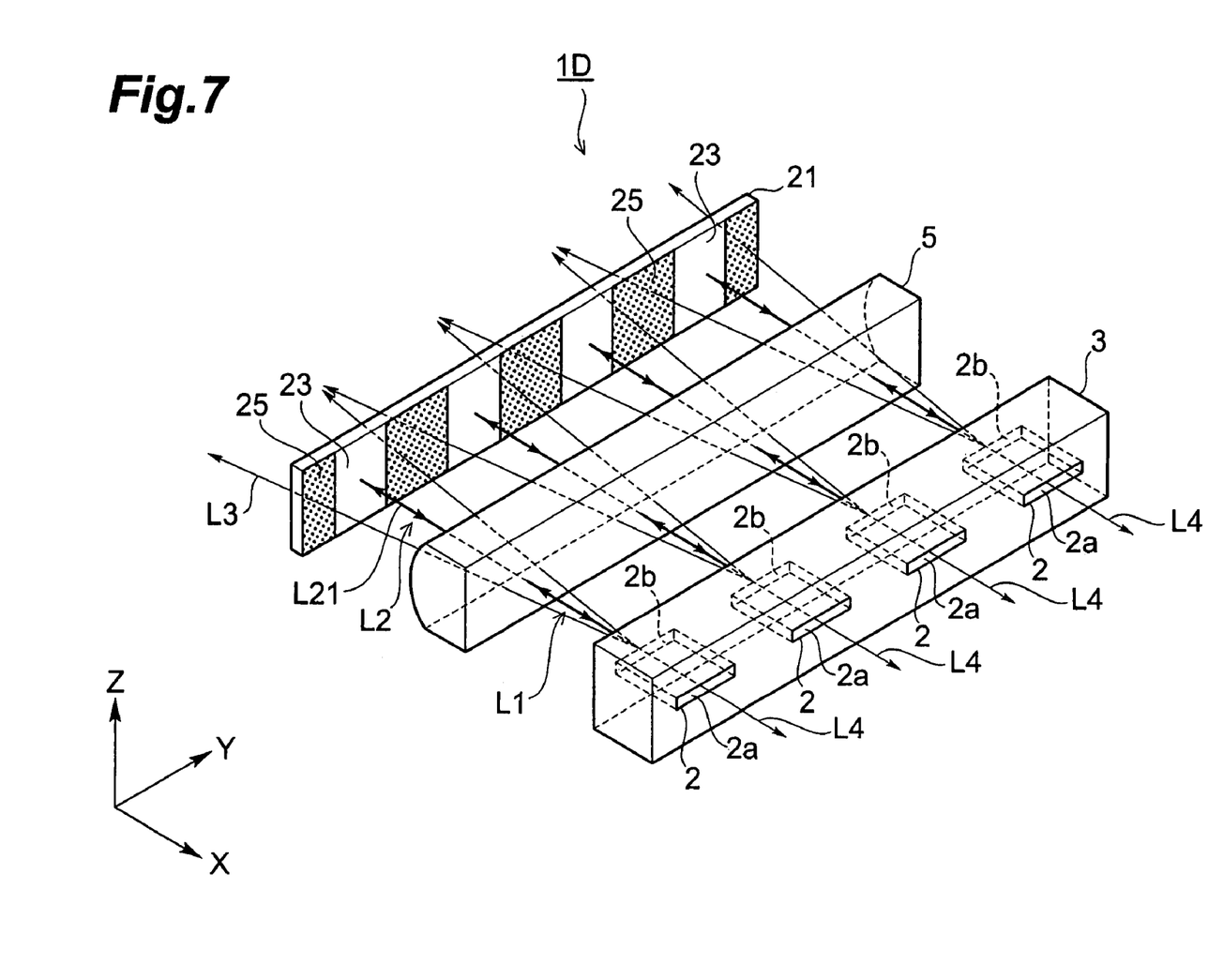
FIG. 7 is a perspective view of a third embodiment of a semiconductor laser device of the invention.

As shown in FIG. 7, the semiconductor laser device 1D is different from the semiconductor laser device 1A in that a stripe mirror 21 (first optical element) is provided in place of the reflecting mirror 9. In the stripe mirror 21, reflecting portions 23 that are disposed corresponding to the positions of the respective active layers 2 and reflect laser beams outputted from the collimating lens 5 and transmitting portions 25 that transmit laser beams outputted from the collimating lens 5 are alternately arranged in the Y axis direction. Therefore, in the semiconductor laser device 1D, in the laser beams L2 outputted rearward from the collimating lens 5, only laser beams L21 made incident perpendicularly on the reflecting portions 23 are reflected in almost opposite directions, and fed back to the respective active layers 2 again via the collimating lens 5 by tracing optical paths in complete reverse to the optical paths reaching the reflecting portions 23 from the active layers 2. Thus, in the semiconductor laser device 1D, an external resonator is formed between the respective reflecting portions 23 and the front end faces 2a of the respective active layers 2, whereby it becomes possible that the expansion angles in the Y axis direction of the laser beams outputted from the respective active layers 2 of the semiconductor laser array 3 are further reduced and the laser beams L4 are outputted.

On the other hand, the laser beams L3 (remainders of the laser beams) other than the laser beams L21 of the laser beams L2 are transmitted through the transmitting portions 25 and outputted rearward of the stripe mirror 21, and emitted to the outside of the semiconductor laser device 1D. Thereby, the laser beams L3 are prevented from reaching the semiconductor laser array 3 again, so that heating of the semiconductor laser array 3 can be suppressed.

In the semiconductor laser device 1D, wavelength selecting portions having characteristics similar to those of the wavelength selecting element 11 can be installed in place of the reflecting portions 23. Thereby, it becomes further possible to narrow the band of the wavelength spectrum of the laser beams and output the laser beams L4.

Fourth Embodiment

Figure 8:
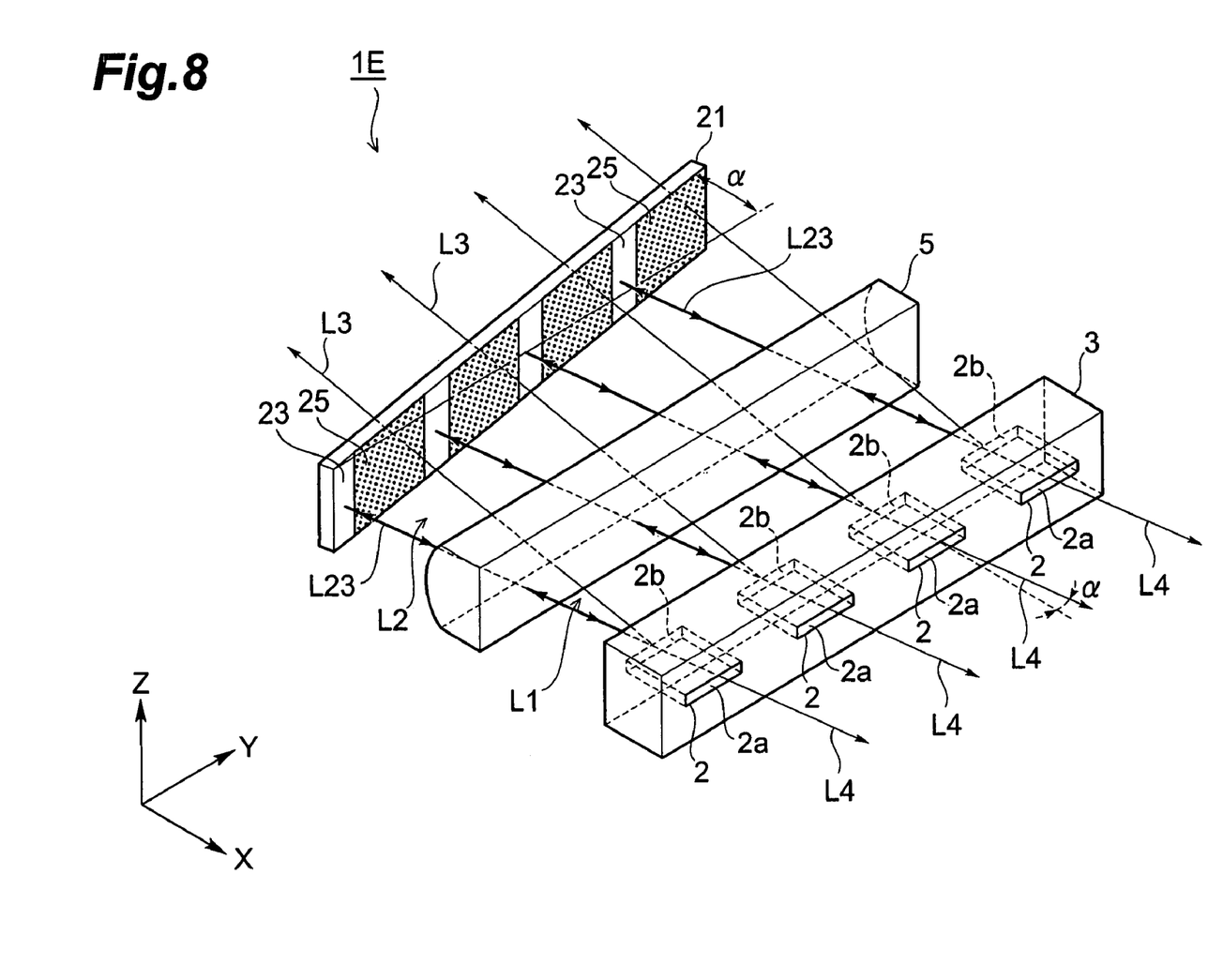
FIG. 8 is a perspective view of a fourth embodiment of a semiconductor laser device of the invention.

As shown in FIG. 8, the semiconductor laser device 1E is different from the semiconductor laser device 1D in that the stripe mirror 21 is disposed while being inclined with respect to a plane orthogonal to the X axis direction (that is, YZ plane). In detail, this stripe mirror 21 is disposed at an angle α with the YZ plane and the reflecting surfaces of the reflecting portions 23 of the stripe mirror 21 are inclined by the angle α with respect to the YZ plane around the Z axis. Therefore, in the semiconductor laser device 1E, of the laser beams L2 outputted rearward from the collimating lens 5, only laser beams L23 outputted in the direction at the angle α with the X axis are selectively amplified by the external resonator formed between the reflecting portions 23 and the respective front end faces 2a. Thereby, it becomes possible that the expansion angles in the Y axis direction of the laser beams outputted from the respective active layers 2 of the semiconductor laser array 3 are further reduced, and the laser beams L4 are outputted in the direction at the angle α with the X axis direction.

On the other hand, laser beams L3 (remainders of the laser beams) other than the laser beams L23 of the laser beams L2 are transmitted through the transmitting portions 25 and outputted rearward of the stripe mirror 21, and emitted to the outside of the semiconductor laser device 1E. Thereby, the laser beams L3 are prevented from reaching the semiconductor laser array 3 again, so that heating of the semiconductor laser array 3 can be suppressed.

In the semiconductor laser device 1E, it is also possible that wavelength selecting portions having characteristics similar to those of the wavelength selecting element 11 are installed in place of the reflecting portions 23. Thereby, it becomes further possible to narrow the band of the wavelength spectrum of the laser beams and output the laser beams L4.

Fifth Embodiment

Figure 9:
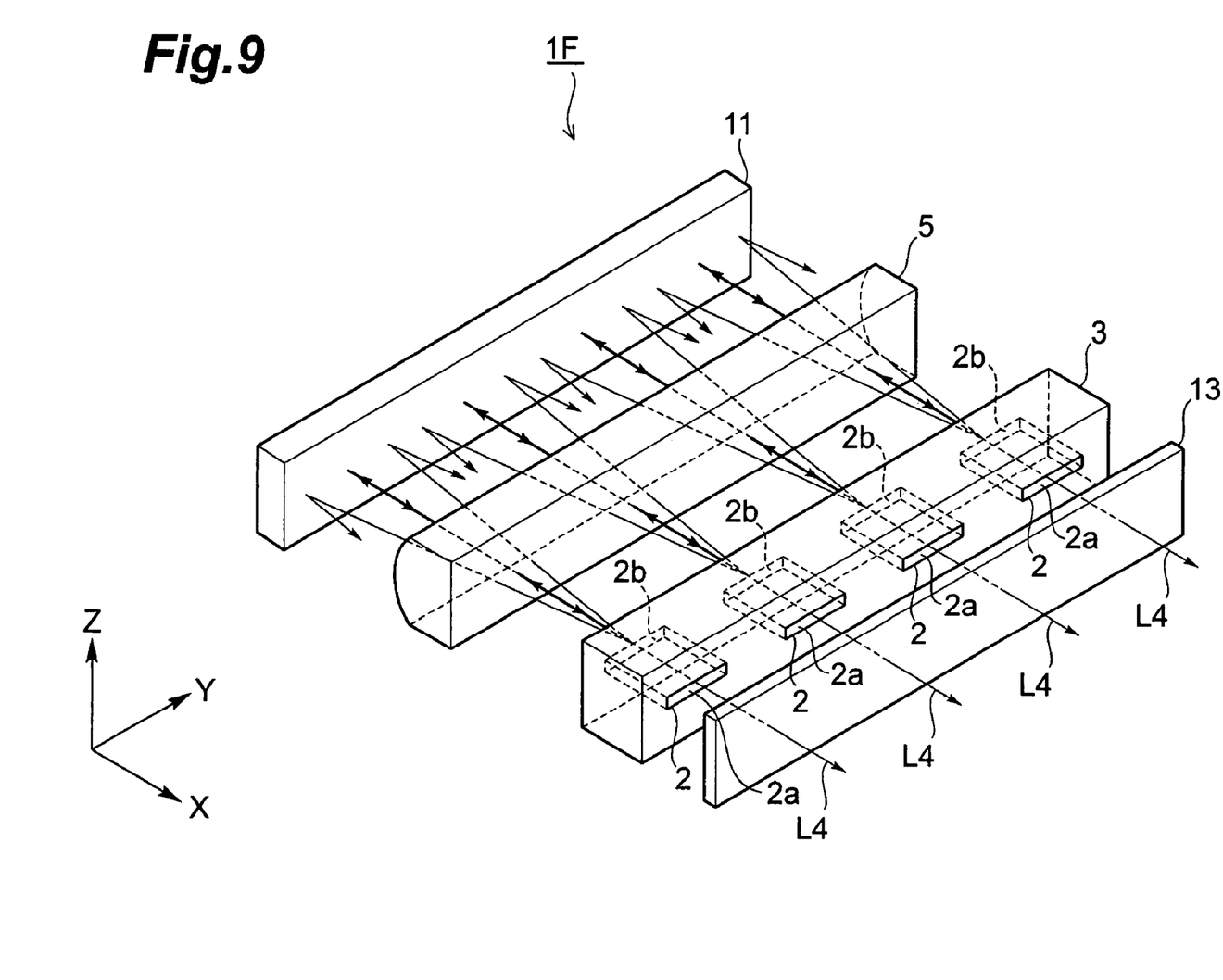
FIG. 9 is a perspective view of a fifth embodiment of a semiconductor laser device of the invention.

As shown in FIG. 9, the semiconductor laser device 1F is different from the semiconductor laser device 1B in that another wavelength selecting element 13 (second optical element) that bragg-reflects and feeds back the respective laser beams outputted forward from the front end faces 2a of the active layers 2 to the respective active layers 2 is provided further forward of the semiconductor laser array 3. The semiconductor laser device 1F is also different from the semiconductor laser device 1B in that the reflectance of the reflection suppressing films formed on the front end faces 2a of the respective active layers 2 is equal to the reflectance of the reflection suppressing films formed on the rear end faces 2b. The wavelength selecting element 13 has characteristics that have a high reflectance for laser beams close to a specific wavelength λ2 (herein, 808.4 nanometers) different from that of the wavelength selecting element 11, and almost transmits the other laser beams. The reflectance for the laser beams with the specific wavelength is lower in the wavelength selecting element 13 in comparison with the reflectance of approximately 95% of the wavelength selecting element 11, and is set to, for example, 45 through 50%. In this semiconductor laser device 1F, an external resonator is formed between the wavelength selecting element 11 that bragg-reflects laser beams close to the wavelength λ1 (herein, 808.0 nanometers) and the wavelength selecting element 13 that bragg-reflects laser beams close to the wavelength λ2. Thereby, laser beams close to a wavelength λ3 (herein, 808.2 nanometers) as a overlapping portion between laser beams close to the specific wavelength λ1 to be reflected by the wavelength selecting element 11 and laser beams close to the specific wavelength λ2 to be reflected by the wavelength selecting element 13 reciprocate between the wavelength selecting element 11 and the wavelength selecting element 13 while being amplified by the active layers 2.

Figure 10:
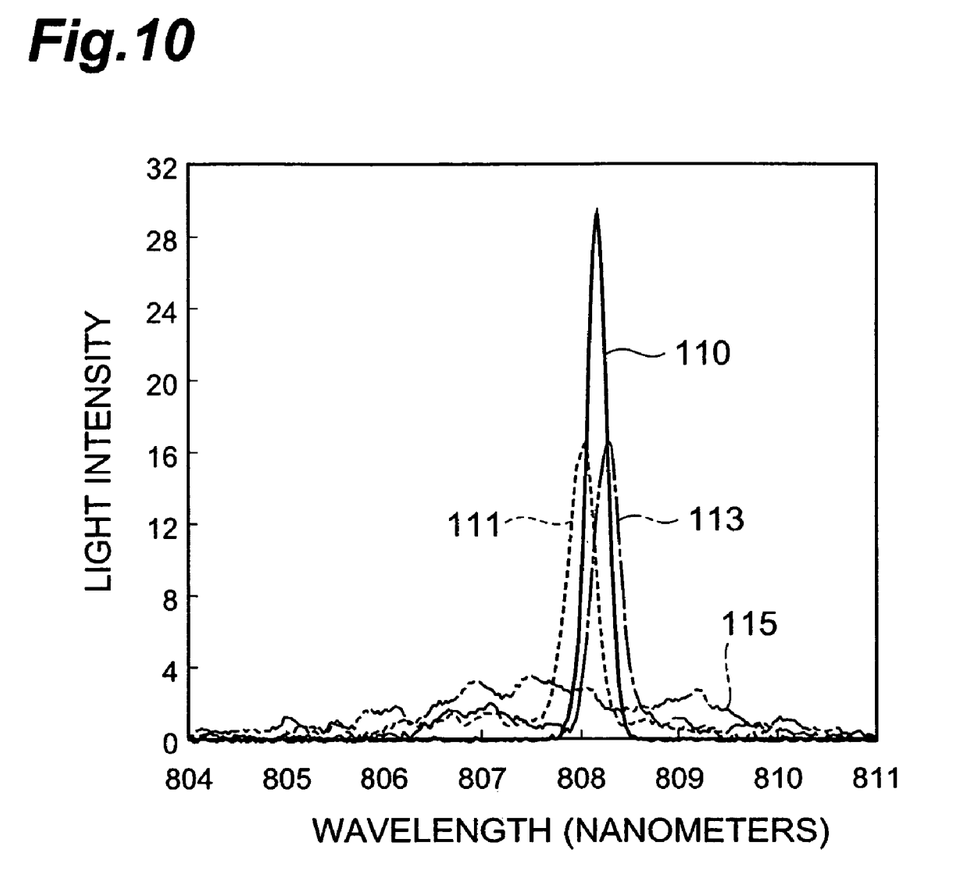
FIG. 10 is a diagrammatic diagram of light intensity distribution with respect to wavelengths of laser beams.

Then, laser beams L4 that are parts of the amplified laser beams are transmitted through the wavelength selecting element 13 and outputted forward. Therefore, it becomes possible that the expansion angles in the Y axis direction of the laser beams outputted from the active layers 2 of the semiconductor laser array are reduced, the band of the wavelength spectrum of the laser beams are further narrowed, and as shown by the diagrammatic diagram 110 of FIG. 10, the laser beams L4 with light intensity distribution having a peak at the wavelength λ3 between the wavelength λ1 and the wavelength λ2 can be outputted. In FIG. 10, the diagrammatic diagram 111 shows light intensity distribution of the laser beams L4 when the wavelength selecting element 13 is removed from the semiconductor laser 1F. The diagrammatic diagram 113 shows light intensity distribution of the laser beams L4 when the wavelength selecting element 11 is removed from the semiconductor laser 1F. The diagrammatic diagram 115 shows light intensity distribution of laser beams L4 when both the wavelength selecting element 11 and the wavelength selecting element 13 are removed from the semiconductor laser 1F.

Sixth Embodiment

Figure 11:
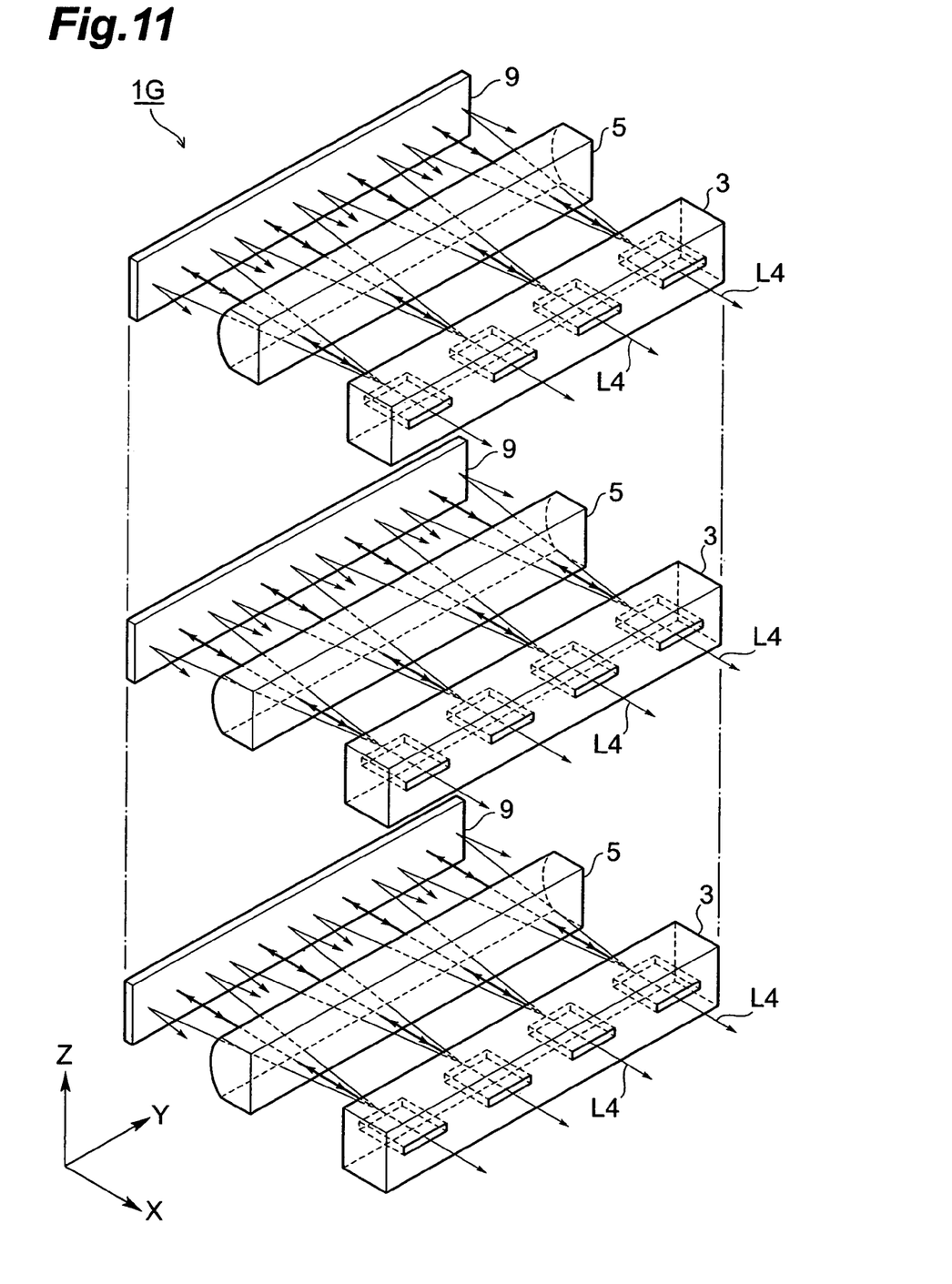
FIG. 11 is a perspective view of a sixth embodiment of a semiconductor laser device of the invention.

The semiconductor laser device 1G shown in FIG. 11 is formed by layering a plurality of sets of the parts including the semiconductor laser array 3, the collimating lens 5, and the reflecting mirror 9 of the semiconductor laser device 1A in the Z axis direction. In this case, between the semiconductor laser arrays 3 adjacent to each other in the Z axis direction, a water-cooling heat sink can be inserted for cooling the semiconductor laser arrays 3 that heats. Thus, by layering the plurality of sets of parts, a semiconductor laser device with a high output can be obtained. It is also possible that, in place of the plurality of reflecting mirrors 9 layered in the Z axis direction, one reflecting mirror which all laser beams from the respective layered collimating lenses 5 are made incident on is employed. In the same manner in the semiconductor laser device 1A, the respective parts of the semiconductor laser devices 1B, 1C, 1D, 1E, and 1F are also layered in the Y axis direction, whereby semiconductor laser devices with high outputs can be obtained. In such semiconductor laser devices, laser beams L4 with small expansion angles are outputted from the respective layered portions, so that laser beams whose expansion angles are entirely small and having high light intensities are obtained.

According to the invention, the expansion angles in the slow axis direction of laser beams outputted from the respective active layers of the semiconductor laser array are reduced and the laser beams are outputted.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of following claims.

What is claimed is:

1. A semiconductor laser device that includes a semiconductor laser array having a plurality of active layers, while setting a first direction to an optical axis direction, a second direction to a slow axis direction, and a third direction to a fast axis direction, arranged in parallel along the second direction and outputs laser beams from a front end face side of the active layers, comprising:
    a collimating lens that collimates laser beams outputted from respective rear end faces of the active layers within a plane orthogonal to the second direction; and
    a first optical element that feeds back respective parts of laser beams outputted from the collimating lens to the respective active layers via the collimating lens,
    wherein the first optical element is a stripe mirror having transmitting portions and reflecting portions which are alternately arranged in the second direction,
    wherein the reflecting portions of the stripe mirror are disposed corresponding to the positions of the respective active layers of the semiconductor laser array,
    wherein the respective reflecting portions of the stripe mirror and the front end face side of the respective active layers are configured so that they form an external resonator that makes laser beams reciprocate between the respective reflecting portions of the stripe mirror and the front end face side of the respective active layers, and
    wherein the transmitting portions of the stripe mirror transmit a laser light which is emitted from the collimating lens in a direction backward of the stripe mirror so that the transmitted laser light does not contribute to the external resonation.

2. The semiconductor laser device according to claim 1, wherein the first optical element is disposed while being inclined with respect to a plane orthogonal to the first direction.

3. The semiconductor laser device according to claim 1, wherein the first optical element bragg-reflects and feeds back respective laser beams with a specific wavelength of the laser beams outputted from the collimating lens to the respective active layers.

4. A semiconductor laser device that includes a semiconductor laser array having a plurality of active layers, while setting a first direction to an optical axis direction, a second direction to a slow axis direction, and a third direction to a fast axis direction, arranged in parallel along the second direction and outputs laser beams from a front end face side of the active layers, comprising:
    a collimating lens that collimates laser beams outputted from respective rear end faces of the active layers within a plane orthogonal to the second direction;
    a first optical element that feeds back respective parts of laser beams outputted from the collimating lens to the respective active layers via the collimating lens; and
    a second optical element that has a light reflectance lower than that of the first optical element,
    wherein the first optical element is a stripe mirror having transmitting portions and reflecting portions which are alternately arranged in the second direction, wherein the reflecting portions of the stripe mirror are disposed corresponding to the positions of the respective active layers of the semiconductor laser array, wherein the respective active layers of the stripe mirror and the second optical element are configured so that they form an external resonator that makes laser beams reciprocate between the reflecting portions of the stripe mirror and the second optical element, and wherein the transmitting portions of the stripe mirror transmit a laser light which is emitted from the collimating lens in a direction backward of the stripe mirror so that the transmitted laser light does not contribute to the external resonation.

5. The semiconductor laser device according to claim 4, wherein the second optical element bragg-reflects and feeds back respective laser beams with a specific wavelength of laser beams outputted from the respective front end faces of the active layers to the respective active layers.

* * * * *